United States Patent [19]
Booth et al.

[11] Patent Number: 5,198,189
[45] Date of Patent: Mar. 30, 1993

[54] LIQUID METAL MATRIX THERMAL PASTE

[75] Inventors: Richard B. Booth, Wappingers Falls; Gary W. Grube, Washingtonville; Peter A. Gruber, Mohegan Lake; Igor Y. Khandros, Peekskill; Arthur R. Zingher, White Plains, all of N.Y.

[73] Assignee: International Business Machines Corporation, Armonk, N.Y.

[21] Appl. No.: 870,152

[22] Filed: Apr. 13, 1992

Related U.S. Application Data

[63] Continuation of Ser. No. 389,131, Aug. 3, 1989.

[51] Int. Cl.$^5$ ............................................. C22C 28/00
[52] U.S. Cl. ....................................... 420/555; 252/387
[58] Field of Search ................... 420/555; 228/180.2; 252/387

[56] References Cited

U.S. PATENT DOCUMENTS

| | | | |
|---|---|---|---|
| 3,150,901 | 9/1964 | Esten et al. | 308/241 |
| 3,169,859 | 2/1965 | Treaftis et al. | 75/134 |
| 3,175,893 | 3/1965 | Meretsky et al. | 29/197 |
| 3,209,450 | 10/1965 | Klein et al. | 29/492 |
| 3,839,780 | 10/1974 | Freedman et al. | 29/501 |
| 4,092,697 | 5/1976 | Spaight | 361/386 |
| 4,233,103 | 11/1980 | Shaheen | 156/331 |
| 4,239,534 | 12/1980 | Taketoshi | 75/134 T |
| 4,323,914 | 4/1982 | Berndlmaier et al. | 357/82 |
| 4,398,975 | 8/1983 | Ohsawa et al. | 148/400 |
| 4,659,384 | 4/1987 | Daigo et al. | 106/35 |
| 5,012,858 | 5/1991 | Natori et al. | 420/555 |
| 5,024,264 | 6/1991 | Natori et al. | 420/555 |
| 5,053,195 | 10/1991 | MacKay | 420/555 |
| 5,056,706 | 10/1991 | Dolbear et al. | 228/180.2 |

FOREIGN PATENT DOCUMENTS

| | | |
|---|---|---|
| 0009605 | 4/1980 | European Pat. Off. |
| 332981 | 4/1972 | U.S.S.R. ............ 420/555 |

OTHER PUBLICATIONS

Patent Abstracts of Japan, vol. 12, No. 342 (E-658), Sep. 14th, 1988; JP-A-63 102 345 (Fujitsu Ltd) May 7, 1988.
Patent Abstracts of Japan, vol. 8, No. 236 (C-249), Oct. 30th, 1984; and JP-A-59 116 357 (Hitachi Seisakusho K.K.) Jul. 5, 1984.
Patent Abstracts of Japan, vol. 7, No. 218 (E-200), Sep. 28th, 1983; and JP-A-58 111 354 (Hitachi Seisakusho K.K.) Jul. 2, 1983.
Patent Abstracts of Japan, vol. 11, No. 3 (C-395), Jan. 7th, 1987; and JP-A-61 179 844 (Tokuriki Honten Co., Ltd) Aug. 12, 1986.

*Primary Examiner*—Peter D. Rosenberg
*Attorney, Agent, or Firm*—Philip J. Feig

[57] ABSTRACT

A liquid metal matrix thermal paste comprises a dispersion of non-reacting thermally conductive particles in a low melting temperature liquid metal matrix. The particles preferably are silicon, molybdenum, tungsten or other materials which do not react with gallium at temperatures below approximately 100° C. The preferred liquid metals are gallium and indium eutectic, gallium and tin eutectic and gallium, indium and tin ternary eutectic. The particles may be coated with a noble metal to minimize surface oxidation and enhance wettability of the particles. The liquid metal matrix thermal paste is used as a high thermally conducting paste in cooling high power dissipation components in conjunction with a conventional fluid cooling system.

20 Claims, 3 Drawing Sheets

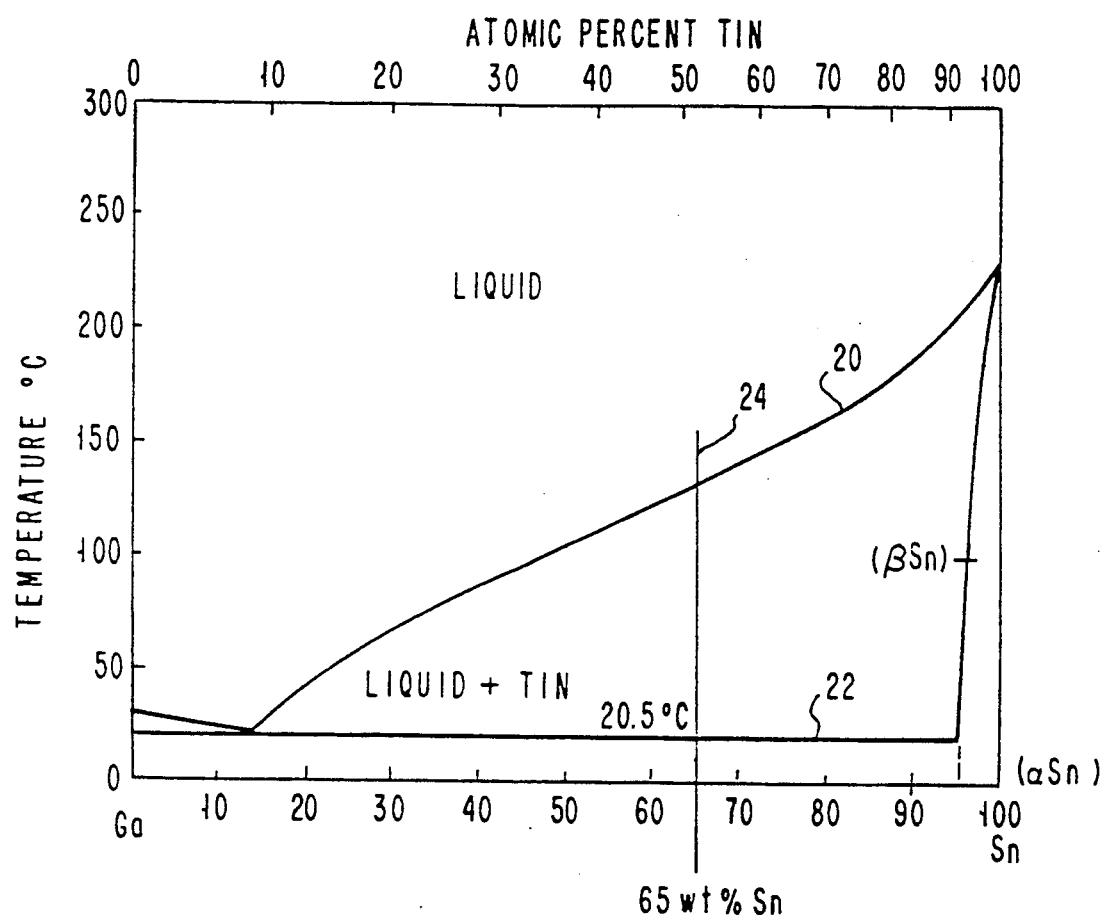

LIQUID METAL MATRIX THERMAL PASTE

This application is a continuation of application Ser. No. 07/389,131 filed Aug. 3, 1989.

BACKGROUND OF THE INVENTION

The present invention relates to thermal paste and particularly relates to a liquid metal matrix thermal paste containing fine thermally conducting particles dispersed in a low melting temperature liquid metal matrix and having high overall thermal conductivity. The thermal paste is used to form a thermal joint between an electronic component, such as a chip, and a cooling system.

Modern very high performance electronic systems often require a high density of chips having many high power gates. These electronic systems require cooling a high power density through a limited temperature drop from a device junction to a cooling system. In order to achieve the cooling requirement, the thermal joint from the chip to the cooling system must possess a high thermal conductivity. The thermal paste described hereinafter provides the highest available thermal conductivity thermal joint between a chip or component and the cooling system obtained to date.

In practical applications, the joint, in addition to providing high thermal conductivity, must compensate for certain manufacturing tolerances inherent in any electronic assembly. For instance, when assembling chips using the so-called controlled collapse circuit connector technique (hereinafter referred to as C4), as a result of variations in the size and shape of the solder ball arrays used to connect the chip to a printed circuit board, there are significant variations in chip height and tilt relative to the printed circuit board. The electrical connections, the C4 solder balls, are very fragile and the thermal joint must permit a certain amount of differential motion of the individual chips forming an electrical system assembly. Also, manufacturing tolerances cause variations of the gap between the chip and the cooling system. The combination of geometric variations and tolerances conflict with the goal of achieving good thermal conduction by causing a very thin paste layer to be manifest between certain of the chips and the cooling system. Despite the difficulty encountered, good thermal conduction is still achievable by using a paste having high bulk thermal conductivity properties.

Using known conventional thermal paste has provided moderately good heat transfer plus moderate compliance. A commonly used paste contains a mixture of zinc oxide in mineral oil. Such pastes have an upper limit of thermal conductivity. Also, the liquid and particles tend to phase separate after many power on-off cycles. The conventional pastes rely upon the perculation of oxide particles in a low conductivity oil matrix for thermal conductivity. The use of a low conductivity oil matrix is the primary limiting factor in achieving high thermal conductivity. The present invention provides for a high thermal conductivity of both the liquid matrix and the dispersed particles.

There have been many proposals to use liquid metal thermal joints, particularly mercury, which may be harmful both to humans and electronic circuits. However, confining the liquid metal has been prohibitively difficult and requires a reduction of the thermal conductivity. For instance, U.S. Pat. No. 4,092,697 teaches a thermal joint pillow with a plastic film skin and macroscopic filling of liquid metal. Also, U.S. Pat. No. 4,323,914 teaches the coating of the entire chip with a parylene film coating and then adding a macroscopic metal joint to the cooling cap. Both of these patents degrade the thermal conductivity of the joint by including a poor thermal conductivity plastic film.

SUMMARY OF THE INVENTION

The present invention provides a liquid metal matrix thermal paste containing fine thermally conductive particles dispersed in a low melting temperature liquid metal matrix. Preferably, the particles are metal or conductive non-metals selected to be non-reactive with the liquid metal matrix at low temperature in order to provide a semi-liquid fully compliant structure for an indefinite period of time. The particles are preferably tungsten, molybdenum, silicon or other metals or high thermal conductivity materials which have a very low interaction rate with gallium, tin and indium at low temperature, i.e. at temperatures below approximately 100° C. The particles can also be non-metals having high thermal conductivity, such as diamonds. The particles can be coated to enhance wettability. The preferred liquid metal matrix are gallium and indium eutectic alloys, gallium and tin eutectic alloys, and gallium, indium and tin ternary eutectic alloys.

The liquid metal matrix thermal paste is formulated as described below as a gallium-metal paste which permanently and indefinitely retains its semi-liquid state under normal operating conditions and environment to serve as a compliant thermal interface. The resultant paste acts as a high thermal conductive medium which is formed into a desired shape to enhance thermal transfer. By retaining its semi-liquid state under normal operating conditions without solidifying, the enhanced thermal transfer via the paste is sustained during many on-off power cycles when the components of the cooling system expand and contract. The differential expansion of the various components results in significant thermal stresses, which are particularly damaging at the component interfaces. A paste which solidifies over time, and therefore, does not provide a compliant interface, will eventually crack after repeated expansion and contraction and cease to function as a good thermal transfer medium.

A principal object of the present invention is, therefore, the provision of liquid metal matrix thermal paste having a high thermal conductivity while remaining in a semi-liquid state for an indefinite period of time.

Another object of the invention is the provision of a liquid metal matrix thermal paste having high thermal conductivity and adjustable viscosity.

A further object of the invention is the provision of a liquid metal matrix thermal paste having high thermal conductivity for use as a thermal joint between an electrical component, such as a chip, and a cooling system, or between successive parts of a cooling system.

A still further object of the invention is the provision of a liquid metal matrix thermal paste containing fine thermally conducting particles dispersed in a low temperature liquid metal matrix which is stable for an indefinite period of time.

A still further object of the invention is the provision of a process for preparing a liquid metal matrix thermal paste.

Further and still other objects of the invention will become more clearly apparent when the following de-

BRIEF DESCRIPTION OF THE DRAWINGS

FIG. 3 is a phase diagram of gallium-tin eutectic;

DETAILED DESCRIPTION

Figure 1:
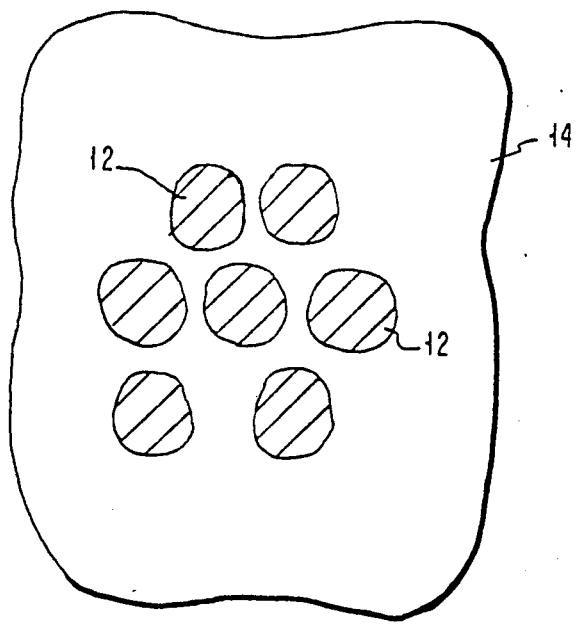
FIG. 1 is a cross-sectional representation of thermally conducting particles dispersed in a liquid metal matrix.

Referring to the figures and to FIG. 1 in particular, there is shown schematically in cross-section a liquid metal matrix thermal paste. The thermal paste contains thermally conductive particles 12, dispersed in a liquid metal matrix 14.

Figure 2A:
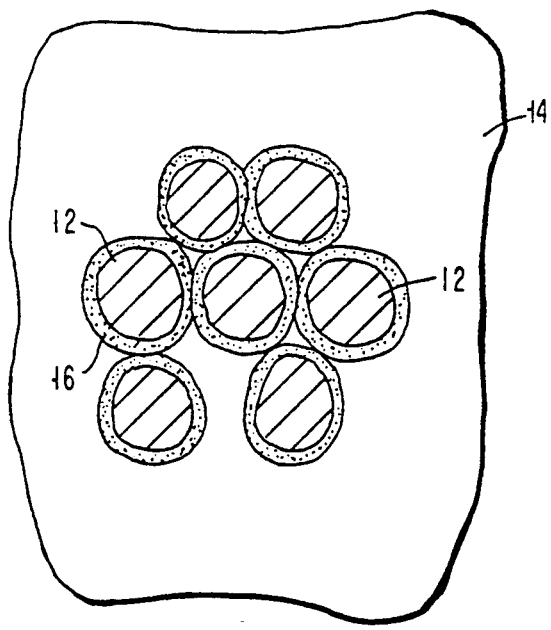
FIG. 2A is a cross-sectional representation of coated thermally conducting particles dispersed in a liquid metal matrix as initially mixed.
Figure 2B:
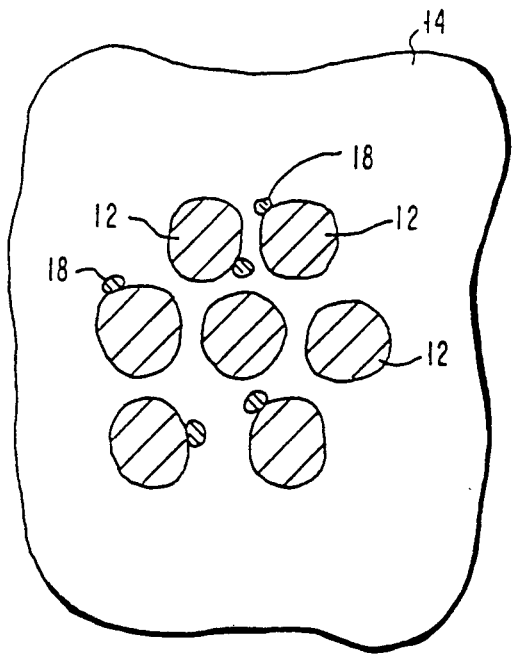
FIG. 2B is a cross-sectional representation of coated thermally conductive particles dispersed in a liquid metal matrix after the coating dissolves and when ready to be used.

The liquid metal matrix thermal paste of the present invention comprises fine thermally conductive particles dispersed in a low melting temperature liquid metal matrix. Preferred liquid metals are gallium and indium eutectic (75.4 wt % +24.6 wt %, MP 15.7° C.), gallium and tin eutectic (86.3 wt % +13.7 wt %, MP 20.5° C.), gallium, indium and tin ternary eutectic (21.5 wt % +16.0 wt % +62.5 wt %, MP 10.7° C.), and several quarternary systems having melting points as low as 7° C. The ratios in the parenthesis are the preferred mixture composition and melting point of each alloy. The particles are metals or thermally conductive non-metals. The particles are selected to be non-reactive with the liquid metal, such as gallium, at low temperatures of less than approximately 100° C. in order to provide a semi-liquid fully compliant paste for an indefinite period of time. Preferred particles are tungsten, molybdenum, silicon or other particles having a low interaction rate with gallium at low temperatures, i.e. at temperatures below approximately 100° C. Most of the particle materials, particularly silicon, molybdenum or tungsten will have an oxide layer on the surface which will impede wetting by a liquid metal. Therefore, referring to FIG. 2A, such particles are coated with a thin layer of a noble metal 16, such as gold, palladium or silver, with the preferred metal being gold. The thin noble metal layer, e.g. gold, dissolves in gallium without affecting the composition significantly thereby ensuring wetting between the exposed metal particle and the gallium. As shown in FIG. 2B, after the noble metal coating dissolves, gold-gallium intermetallics 18 are formed and remain attached to the particles.

For optimum rheology of the thermal paste, spherical particles are preferred. Commonly available tungsten and molybdenum powders are not spherical, but rather are of an irregular shape. In order to overcome this problem, spherical metallic particles, such as copper, are coated with a barrier layer of tungsten or molybdenum which, in turn, is coated by a thin layer of a noble metal, such as gold. Alternatively, the tungsten or molybdenum particles may be made spherical using any of several known techniques. A preferred technique being plasma remelting and solidification of the particles.

In order to maximize a solid filler while still maintaining low viscosity, a bi- or tri-modal distribution of particles is used, which increases the higher thermal conductivity solid phase of the paste.

The liquid metal matrix paste is prepared using conventional paste making techniques. The preferred method is a combination of planetary mixing and a three roll mill dispersion. The mixing hardware should be coated with one of the numerous available coatings, such as tungsten, oxides, nitrides or carbides of any one of several elements, in order to prevent contamination of the paste by dissolved elements.

The figures contained in the application depicting the paste are not drawn to any particular scale but rather are presented in order to better describe the invention by means of illustrations.

Liquid Metal Thermal Paste Properties

Liquid gallium and its alloys have a thermal conductivity of approximately 28 W/MK. Solid tungsten has a thermal conductivity of 170 W/MK. A dispersion of tungsten in a liquid gallium matrix will have a thermal conductivity in the range between 28 and 170 W/MK. The exact value of the thermal conductivity will depend upon fraction and dispersion of the solid phase in the resultant paste.

The mathematical expression of the thermal resistivity of a joint contains bulk thermal resistivity and surface thermal resistivity terms. The bulk thermal resistivity term is proportional to the joint thickness. The surface thermal resistivity term is dependent upon particle size and surface finish. The surface thermal resistivity term is generally independent of the joint thickness provided it is a large value compared to the particle size term. The particle size, in turn, provides a limit on the minimum joint thickness. The particle size also sets a scale for the magnitude of the surface effects. For a given joint thickness, reduction of a particle size as well as bimodal distribution will diminish the surface effects contribution to thermal resistance. The liquid metal matrix thermal paste of the present invention with micron sized particles where a typical surface term equals 2 microns of bulk, or $2E-6M/200 \text{ W/MK} = 1E-8 \text{ KM}^2/\text{W} = 0.000,1$ K per $\text{W/cm}^2$. A thermal resistivity of this magnitude is considered excellent for most applications.

Liquid Metal Confinement

In order to prevent liquid metal from contacting nearby conductors or components, polymeric or other barriers, including encapsulating compounds as fillers of the empty space between components, may be used.

Certain families of chips are required to be electrically isolated from the metal joint. Applying chemical vapor deposited amorphous carbon to the chip at a moderate temperature, even after the chips have been bonded to the common substrate of the multi-chip module, provides a reliable pinhole free electrical insulator having a very low thermal resistivity. Alternatively, the application of thin dielectrics, such as $SiO_2$ or SiN, to each wafer before dicing also provides electrical isolation. In certain wafer processing steps $SiO_2$ is formed on the chip which then can be stripped off or left on the wafer as required.

In order to provide additional control of any excess liquid metal matrix thermal paste, a blotter, which can even be a fine mesh of a metal wire, is used.

It is well known that thermal resistivity is improved when the thermal joint is thin. In order to form a thin joint, low viscosity thermal paste is required. Pending U.S. patent application Ser. No. 07/161,880, describes forming of a 1 mil thick paste joint by simultaneously shearing and compressing conventional thermal paste between a chip and a cooling unit. The same technique applies when using liquid metal matrix thermal paste provided the paste is not excessively stiff. A paste comprising 35 wt % Ga-In-Sn ternary eutectic and 65 wt % tungsten in the form of 10 μm particle size has been thinned to approximately 3 to 5 mils between two quartz slides while maintaining bubble-free interfaces. A paste containing 50 wt % tungsten in the form of 2.2 μm particle size in 50 wt % Ga-In-Sn ternary eutectic was successfully thinned to 2 to 3 mils. Further reduction in joint thickness is possible by optimization of the thinning technique.

Semi-Liquid Metal Matrix

In certain applications better results are attainable when a true liquid metal is not employed. In these instances, a semi-liquid alloy having a large liquidus-solidus range is useable. During formation of the thermal paste or during assembly of the components with the cooling system, the thermal paste is sometimes heated to become a true liquid metal. However, when the heated liquid is used in a low or moderate temperature application or operating environment, the liquid will become viscous.

Liquid metal matrix thermal paste according to the present invention, in certain applications, can be melted for only a short period of time. The brief melt period differs from solder reflow because the liquid metal remains as a liquid metal matrix thermal paste throughout the entire temperature cycle.

A gallium-tin system is a preferred suitable system for the described semi-liquid metal matrix. FIG. 3 is a phase diagram of a gallium and tin system. The ordinate axis is the temperature of the mixture and the abscissa represents increasing percentage of tin. At temperatures above the curve 20 for particular ratios of tin and gallium, the mixture is a liquid. Below the horizontal line 22 the mixture is a solid. For combinations of temperature and tin-gallium ratios between the curves 20 and 22 the mixture will be a semi-liquid of variable viscosity depending upon whether the operating point at a particular ratio of tin and gallium is closer to the "liquid line" 20 or "solid line" 22.

For example, vertical line 24 represents a 65 wt % Sn—35 wt % Ga alloy. At a temperature of approximately 21° C. the alloy is 63 wt % solid and 37 wt % liquid. When the alloy is heated above 130° C. it is substantially all liquid. If it is assumed that the thermal paste will be applied to operate for use at an operating temperature of 70° C., the alloy will be 50 wt % solid and 50 wt % liquid. When such an alloy is used instead of a eutectic liquid matrix, the paste exhibits very low viscosity during heating at a temperature in the range between 100° C. and 130° C. After the cooling hardware is assembled and operating at a temperature in the range between 50° and 80° C., the alloy will exhibit increased viscosity. The described system will effectively prevent phase separation of the paste in service.

Figure 4A:
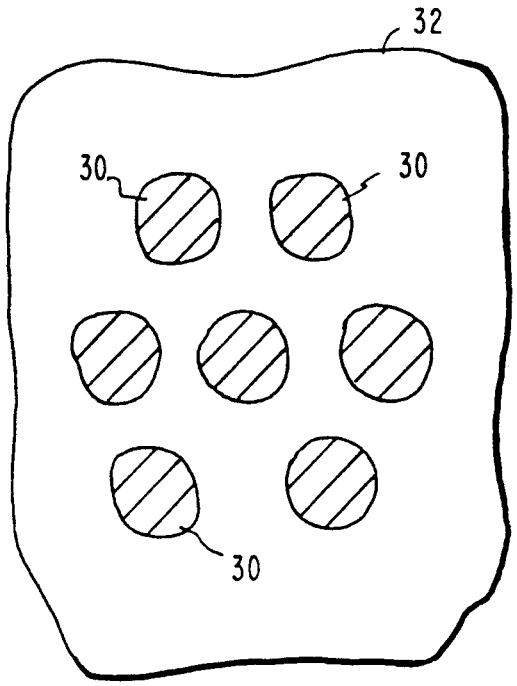
FIG. 4A is a cross-sectional representation of thermally conductive particles dispersed in a liquid metal matrix comprising 65 wt % Sn and 35 wt % Ga at an elevated temperature.
Figure 4B:
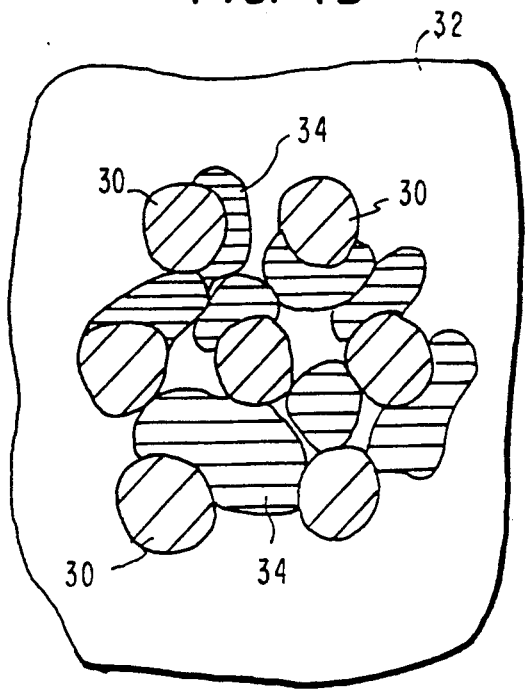
FIG. 4B is a cross-sectional representation of thermally conductive particles dispersed in a liquid metal matrix comprising 65 wt % Sn and 35 wt % Ga at a typical operating temperature.

The system operation is shown schematically in FIGS. 4A and 4B. In FIG. 4A thermally conductive particles 30 are dispersed in a liquid metal matrix 32 comprising 65 wt % tin and 35 wt % gallium at a temperature of 130° C. The metal matrix is substantially all liquid. When the temperature is reduced to 70° C., tin 34 separates from the metal matrix with some quantity of tin adhering to the particles 30. The metal matrix is partially solid and partially liquid thus increasing the viscosity of the paste.

Paste Thickening Technique

Figure 5A:
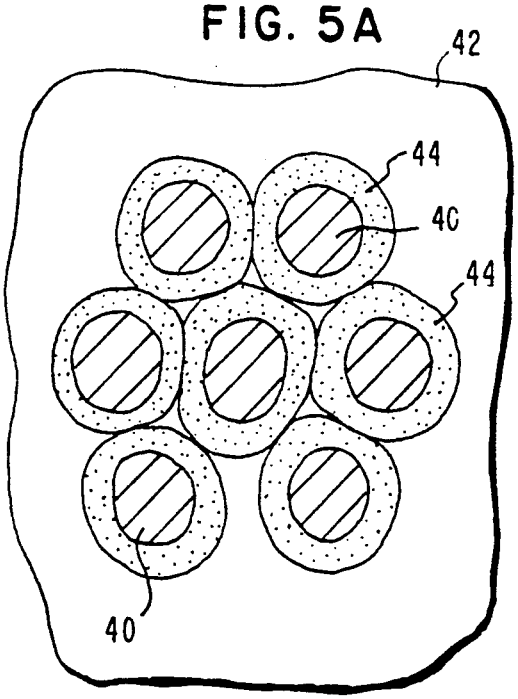
FIG. 5A is a cross-sectional representation of thick coated thermally conductive particles dispersed in a liquid metal matrix as initially mixed.
Figure 5B:
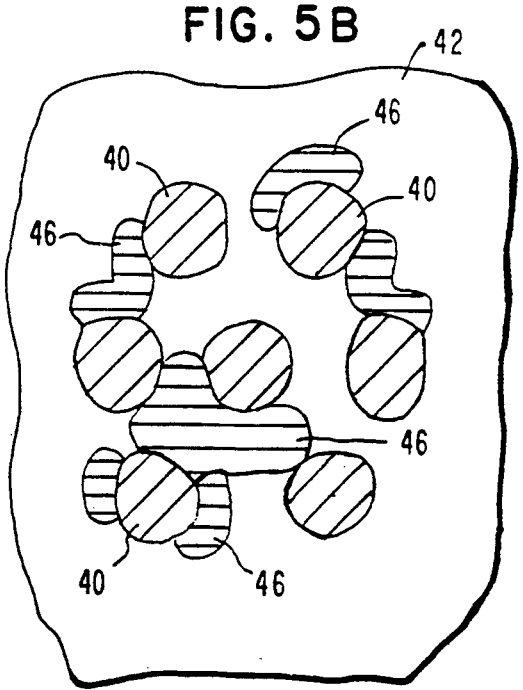
FIG. 5B is a cross-sectional representation of thick coated thermally conductive particles dispersed in a liquid metal matrix when ready to be used.

An alternative method of reducing the possibility of phase separation of the thermal paste and thus ensuring low viscosity of the paste during assembly of the cooling structure and increased viscosity during normal operating conditions is to increase the thickness of the wettable layer on the particles. As shown in FIG. 5A, as initially mixed the particles 40 ,such as tungsten, dispersed in a liquid metal matrix 42, such as gallium, indium and tin ternary eutectic alloy, are coated with a relatively thick layer of a wettable metal, such as gold 44. As the liquid gallium, indium and tin react with the gold layer to produce intermetallic particles 46 as shown in FIG. 5B, the paste viscosity increases and the possibility of phase separation is reduced.

Removal of Liquid Metal Matrix Thermal Paste

Rework generally entails the removal of thermal paste. The bulk of the paste is removable by using a metal wool containing tin or copper filaments. Thorough paste removal usually requires the use of ultrasonic agitation through a thin film of liquid without disturbing other components. Thorough paste removal is also achievable by using a brush or a felt tip and a cleaning liquid. Such a liquid should be non-corrosive and not be a strong organic solvent. Preferred liquids are isopropanoyl or ethanol. Also preferred is hypercritical carbon dioxide. Alternative paste removal methods include brushing with metal wool while using tin powder as a sweeping agent and placing tin foil in contact with the residual paste for removing gallium.

Surface Coating

In order to prevent the leaving of residue from the liquid metal matrix thermal paste such as by adhesion of indium to silicon dioxide glass or to a silicon chip or by metal amalgamation with a solid metal, a non-reactive coating is applied to the chip. The preferred coatings include an ultra thin layer of Teflon or siloxane applied by sputtering and hydrogenated amorphous carbon applied by chemical vapor deposition. Alternatively, a thin tungsten coating applied either by chemical vapor deposition or by sputtering achieves similar results. Both tungsten and hydrogenated carbon coatings have withstood 100 hour exposure at 200° C. in contact with gallium, indium and tin eutectic liquid without any interaction being observed by various analytical techniques. As an additional benefit, these coatings assist in the prevention of thermomigration into and through a semiconductor material to prevent unwanted doping of the chip.

Composite Particles

An alternative method of enhancing wetting, and therefore improving adhesion between the liquid between the liquid metal matrix and the filler metal particles, is by the use of composite metal particles. For example, Si—Au alloyed powder of 80 wt % Si—20 wt % Au composite, if stabilized at a temperature in the temperature range between 200° C. and 300° C., comprises a silicon phase with a gold phase dispersed therein. Such a powder is capable of being produced conventionally by gas atomization. When such a composite powder is dispersed in a gallium liquid matrix, the gallium will preferentially react with gold, while not reacting with the silicon. The result is enhanced wetting and dispersion possibly to a greater extent than surface coating alone. If the gold is located inside the silicon particle, channels will be formed through the particles when the gold reacts with the gallium.

All Metal Matrix Thermal Paste Applications

The liquid metal matrix thermal paste has application with various types of cold plates. The paste may also be used with a piston cooling hat, between the chip and the piston as well as between the piston and cylinder. The paste is usable as a thermal joint which is adjacent to the chip, near but not adjacent to the chip and external to the cooling hat. In addition, the thermal paste is used with discrete components, particularly power components such as rectifiers, transistors and resistors.

EXAMPLES

Example I is a thermal paste of 50 wt % gallium and 50 wt % Mo. The thermal paste was used as a thermal joint between a single chip and a cooling system. The power density was 103 W/cm$^2$ through a total temperature differential of 64° C. including both the joint and other thermal resistivities.

Example II is a thermal paste of 33 wt % Ga-In-Sn ternary eutectic and 67 wt % tungsten comprising irregularly shaped particles having diameters in the range between 5 and 20 $\mu$m. The mixture was mixed in a "Wig-L-Bug" intense vibrator, and subsequently dispersed in a three-roll mill. The bulk thermal conductivity of the paste was measured at 45 W/MK, which is higher than the bulk thermal conductivity of most organic based commercially available thermal paste by a factor of approximately 50 times.

The thermal paste was applied to the same sample chip thermal test module as in Example I. The thermal paste was spread on the module, then simultaneously squeezed and sheared to a thin, approximately 37 $\mu$m thick, layer. A chip dissipating a power density of 518 W/cm$^2$ exhibited a temperature drop (T drop = T junction - T inlet = 85° −23° C.) of 62° C. Interpolating the result to a temperature drop of 60° C. yields a power density of 501 W/cm$^2$. Thus, the total thermal resistivity is ThRy = 12E-6Km$^2$/W = 12 K/mm$^2$/W. The thermal resistivity is the temperature drop across the paste multiplied by the chip area and divided by the power, expressed in units of ° C. per W/cm$^2$. The total ThRy includes the paste itself and all the other components of the thermal path including the cooling hat. The cooling bath water flow was 8 cm$^3$/sec over a cold plate having an area of 1.1 cm$^2$.

Other examples exhibiting satisfactory cooling were 33 wt % Ga-In-Sn ternary eutectic and 67 wt % 10 $\mu$m particles coated with a gold layer and prepared according to the procedure described above.

While there have been described several liquid metal matrix thermal pastes, it will be apparent to those skilled in the art that variations and modifications are possible without deviating from the broad scope of the invention which shall be limited solely by the scope of the claims appended hereto.

What is claimed is:

1. A liquid metal matrix thermal paste comprising a dispersion of thermally conductive particles disposed in a liquid metal matrix selected from the group consisting of liquid gallium and its alloys, said particles being non-reactive with said liquid metal matrix at a temperature below approximately 100° C., whereby the fraction and dispersion of the particles in the liquid metal matrix are such that the resulting paste has a predetermined thermal conductivity and permanently remains compliant.

2. A liquid metal matrix thermal paste as set forth in claim 1, wherein said particle is selected from the group consisting of tungsten, molybdenum, and silicon.

3. A liquid metal matrix thermal paste as set forth in claim 1, wherein said particles are thermally conductive non-metals selected to be non-reactive with said liquid metal matrix.

4. A liquid metal matrix thermal paste as set forth in claim 1, wherein said particles are coated with a thermally conductive material which is non-reactive with said liquid metal matrix at a temperature below approximately 100° C.

5. A liquid metal matrix thermal paste as set forth in claim 4, wherein said particle is selected from the group consisting of tungsten, molybdenum, and silicon.

6. A liquid metal matrix thermal paste as set forth in claim 1 wherein said particles are coated with a noble metal.

7. A liquid metal matrix thermal paste as set forth in claim 6, wherein said noble metal is gold.

8. A liquid metal matrix thermal paste as set forth in claim 2, wherein said particles are coated with a noble metal.

9. A liquid metal matrix thermal paste as set forth in claim 8, wherein said noble metal is gold.

10. A liquid metal matrix thermal paste as set forth in claim 3, wherein said particles are coated with a noble metal.

11. A liquid metal matrix thermal paste as set forth in claim 10, wherein said noble metal is gold.

12. A liquid metal matrix thermal paste as set forth in claim 1, wherein said liquid metal matrix is selected from the group consisting of gallium and indium eutectic, gallium and tin eutectic, and gallium, indium and tin ternary eutectic.

13. A liquid metal matrix thermal paste as set forth in claim 1, wherein said particles are selected from the group consisting of tungsten, molybdenum, and silicon and wherein said liquid metal matrix is selected from the group consisting of gallium and indium eutectic, gallium and tin eutectic and gallium, indium and tin ternary eutectic.

14. A liquid metal matrix thermal paste as set forth in claim 1, consisting of 50 wt % gallium and 50 wt % Mo particles.

15. A liquid metal matrix thermal paste as set forth in claim 1, consisting of 33 wt % gallium, indium and tin ternary eutectic and 67 wt % tungsten particles.

16. A thermal cooling system comprising:
a component to be cooled;

a cooling system; and a liquid metal matrix thermal paste comprising fine particles disposed in a low melting temperature liquid metal matrix, said paste being dispersed between said component and said cooling system.

17. A thermal cooling system as set forth in claim 16, wherein said cooling system comprises a piston and chip cooling system, and said paste is disposed between the piston and the component.

18. A thermal cooling system as set forth in claim 16, where said cooling system comprises a piston, cylinder and chip cooling system, and said paste is disposed between the piston and the cylinder.

19. A method of preparing a liquid metal matrix thermal paste comprising:

providing a low melting temperature liquid metal matrix; and dispersing fine particles into said liquid metal to form a mixture having a high thermal conductivity and being indefinitely in a semi-liquid state.

20. Method of preparing a liquid metal matrix thermal paste as set forth in claim 19, wherein said dispersing is by mixing and subsequent exposure to a roll mill.

* * * * *